United States Patent
Kadota et al.

[11] Patent Number: 5,823,248
[45] Date of Patent: Oct. 20, 1998

[54] COOLING APPARATUS USING BOILING AND CONDENSING REFRIGERANT

[75] Inventors: Shigeru Kadota, Hekinan; Takashi Furukawa, Nagoya; Kiyoshi Kawaguchi, Toyota; Masahiko Suzuki, Hoi-gun; Kenji Yamada, Chiryu, all of Japan

[73] Assignee: Nippondenso Co., Ltd., Kariya, Japan

[21] Appl. No.: 724,594

[22] Filed: Sep. 30, 1996

[30] Foreign Application Priority Data

Oct. 6, 1995 [JP] Japan ................................ 7-259702

[51] Int. Cl.⁶ .................................................. F28D 15/00
[52] U.S. Cl. .................... 165/104.33; 257/715; 361/700; 361/724
[58] Field of Search ............... 165/104.33, 80.4, 165/80.3; 361/700, 724, 698; 257/715, 722

[56] References Cited

U.S. PATENT DOCUMENTS

| | | | |
|---|---|---|---|
| 3,226,602 | 12/1965 | Elfving | 361/700 |
| 3,305,813 | 2/1967 | Toothman et al. | 165/104.33 X |
| 4,027,728 | 6/1977 | Kobayashi et al. | 361/700 X |
| 4,513,346 | 4/1985 | Devins | 361/700 X |
| 4,546,619 | 10/1985 | Rohner | 361/700 X |
| 4,600,050 | 7/1986 | Noren | 165/104.33 X |
| 4,665,466 | 5/1987 | Green | 361/700 X |
| 4,699,208 | 10/1987 | Wolf et al. | 165/80.3 X |
| 4,862,321 | 8/1989 | Saitoo et al. | 361/700 |
| 4,921,039 | 5/1990 | Ghiraldi | 165/104.33 X |
| 4,941,530 | 7/1990 | Crowe | 165/104.33 |
| 4,949,218 | 8/1990 | Blanchard et al. | 165/104.33 X |
| 4,953,634 | 9/1990 | Nelson et al. | 165/80.3 X |
| 5,168,919 | 12/1992 | Berenholz et al. | 165/104.33 X |
| 5,252,778 | 10/1993 | Ogawa | 165/104.33 X |
| 5,285,347 | 2/1994 | Fox et al. | 165/80.3 X |
| 5,471,850 | 12/1995 | Cowans | 165/80.4 X |
| 5,597,035 | 1/1997 | Smith et al. | 165/80.3 |
| 5,613,552 | 3/1997 | Osakabe et al. | 165/104.33 X |

FOREIGN PATENT DOCUMENTS

| | | | |
|---|---|---|---|
| 0509844 | 10/1992 | European Pat. Off. | 165/104.33 |
| 0014257 | 2/1977 | Japan | 165/104.33 |
| 53-037938 | 4/1978 | Japan . | |
| 0128286 | 10/1979 | Japan | 165/104.33 |
| 63-069299 | 3/1988 | Japan . | |
| 1140944 | 6/1989 | Japan | 165/104.33 |
| 0039894 | 2/1991 | Japan | 165/104.33 |
| 3093295 | 4/1991 | Japan | 361/700 |

*Primary Examiner*—Ira S. Lazarus
*Assistant Examiner*—Christopher Atkinson
*Attorney, Agent, or Firm*—Cushman Darby & Cushman IP Group of Pillsbury Madison & Sutro LLP

[57] ABSTRACT

According to the present invention, a cooling apparatus using boiling and condensing refrigerant, includes a refrigerant tank placed in a sealed space formed in a casing, and a radiator placed in a non-sealed space in the casing. Refrigerant is sealed in the refrigerant tank. The refrigerant tank has a metal base plate joined to one wall surface of an extrusion member constituting the refrigerant tank. A base plate has a first heating element having a high heating density fastened thereto with bolts. To another wall surface of the extrusion member is joined a heat-receiving fin which transmits the heat received from the air in the sealed space to the refrigerant in the refrigerant tank and is covered with a cover which also serves as a passage for the air from a fan. In the sealed space where the refrigerant tank is placed, plural second heating elements having low heating densities are placed without being directly attached thereto. In this way, it is possible to cool at least two heating elements having different heating densities and to reduce the size of the apparatus as well as the manufacturing cost.

8 Claims, 11 Drawing Sheets

COOLING APPARATUS USING BOILING AND CONDENSING REFRIGERANT

CROSS REFERENCE TO RELATED APPLICATION

This application is based on and claims priority of Japanese Patent Application No. Hei. 7-259702 filed on Oct. 6, 1995, the content of which is incorporated herein by reference.

BACKGROUND OF THE INVENTION

1. Field Of The Invention:

The present invention relates to a cooling apparatus using boiling and condensing refrigerant, for cooling the heating elements placed with a sealed space.

2. Description Of Related Art:

Conventionally, when the like, heating elements having different heating densities are incorporated into electronic equipment and the like, those heating elements having high heating densities are specially cooled by an air cooling fin, heat pipe, heat siphon, etc. (Refer to JP-A-63-69299), while those heating elements having low heating densities are cooled by natural convection or compulsory convection by ventilation within the device.

However, when the environmental condition under which the apparatus is used include high temperature, high humidity, corrosive atmosphere, or the like, it is necessary to restrict outside air from flowing into the apparatus in order to maintain the reliability of the apparatus. In this case, the internal temperature of the apparatus rises, and it becomes difficult to cool the heating elements having low heating densities natural or compulsory convention within the device. Therefore, in order to solve such problems, the device is contained in a sealed large casing (or chamber), and the internal temperature within the case of the apparatus is lowered by an air conditioner.

When the apparatus includes such a sealed casing and an air conditioner for the casing, the apparatus becomes quite large, however, the above-described method in which the casing is prepared and the air conditioner for the apparatus is employed, the space required for the apparatus increases largely, and as a result, a manufacturing costs as well as an installation costs increase significantly.

SUMMARY OF THE INVENTION

The present invention has been proposed with a view to solving these problems. Therefore, the object of the present invention is to reduce the size and the manufacturing costs of a cooling device designed for cooling a number of heating elements having different heating densities.

According to a first aspect of the present invention, by installing a heat-receiving fin on the refrigerant tank, the heat of the air in the sealed space is transmitted through the heat-absorbing fin to the refrigerant in the refrigerant tank, thereby preventing the temperature within the sealed space from rising. Thus, the first heating elements having a high heating density can be directly installed to the refrigerant tank for cooling, while the second heating elements having a low heating density can be cooled in accordance to a drop in temperature in the sealed space.

As a result, it becomes possible to reduce the size and manufacturing costs of the device because the air conditioner is not required even when cooling plural heating elements having different heating densities.

The refrigerant tank may constitute an extrusion member, and in this way, the refrigerant tank can be bent easily. thus, the installation angle of the radiator to the refrigerant tank can be varied easily.

Further, a part of the extrusion member constituting the refrigerant tank may be bent in a zigzag shape so that the heat-absorbing fins can be interposed between the adjacent wall surfaces to absorb the heat of the air in the sealed space. In this way, not only can a heat-absorbing device be easily constructed but also, the area of the heat-absorbing fin can be increased to improve its cooling performance even when there is only a slight difference in temperature between the inside of the sealed space and the refrigerant. Furthermore, it is possible to provide a heat-absorbing device having an aspect ratio of nearly 1. Thus, a low-cost axial fan can be used.

Further, a third heating element may be attached to the extrusion member with a member having a high thermal conductivity.

Even a heating element which cannot be directly installed on the refrigerant tank due to configurational limitations (e.g., a heating element, a heating density of which is lower than that of a heating element installed on the refrigerant tank) can be cooled by installing it on the extrusion member through a member having high thermal conductivity.

According to a second aspect of the present invention, a part of the liquid return passage for introducing condensed liquid from one of the tanks of the radiator into the refrigerant tank is beat in a zigzag shape, and the heat-absorbing fins are interposed between the adjacent zigzag tubes, thereby the heat of the air in the sealed space is transmitted through the heat-absorbing fins to the refrigerant in the refrigerant tank to prevent the rise of temperature in the sealed space. In this way, the first heating element having a high heating density is cooled by installing it directly to the refrigerant tank, while the second heating element having a low heating density can be cooled in accordance with a drop in temperature in the sealed space.

As a result, even when plural elements having different heating densities have to be cooled, no air conditioner is necessary, so that both the size of the entire device and the manufacturing costs thereof can be reduced.

Further, even those heating elements which cannot be directly installed on the refrigerant tank due to configurational limitations (e.g., third heating elements, heating densities of which are lower than those of the first heating elements directly installed on the refrigerant tank) can be cooled by installing those heating element on the liquid return passage through a member having a high thermal conductivity.

The reliability of the apparatus can be improved by forming the liquid return passage integrally with the refrigerant tank by an extrusion member, to reduce the numbers of parts and joints.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PREFERRED EMBODIMENTS

A cooling apparatus which operates by boiling and condensing refrigerant according to the present invention will be described with reference to the drawings.

A first embodiment of the present invention will be described.

Figure 1:
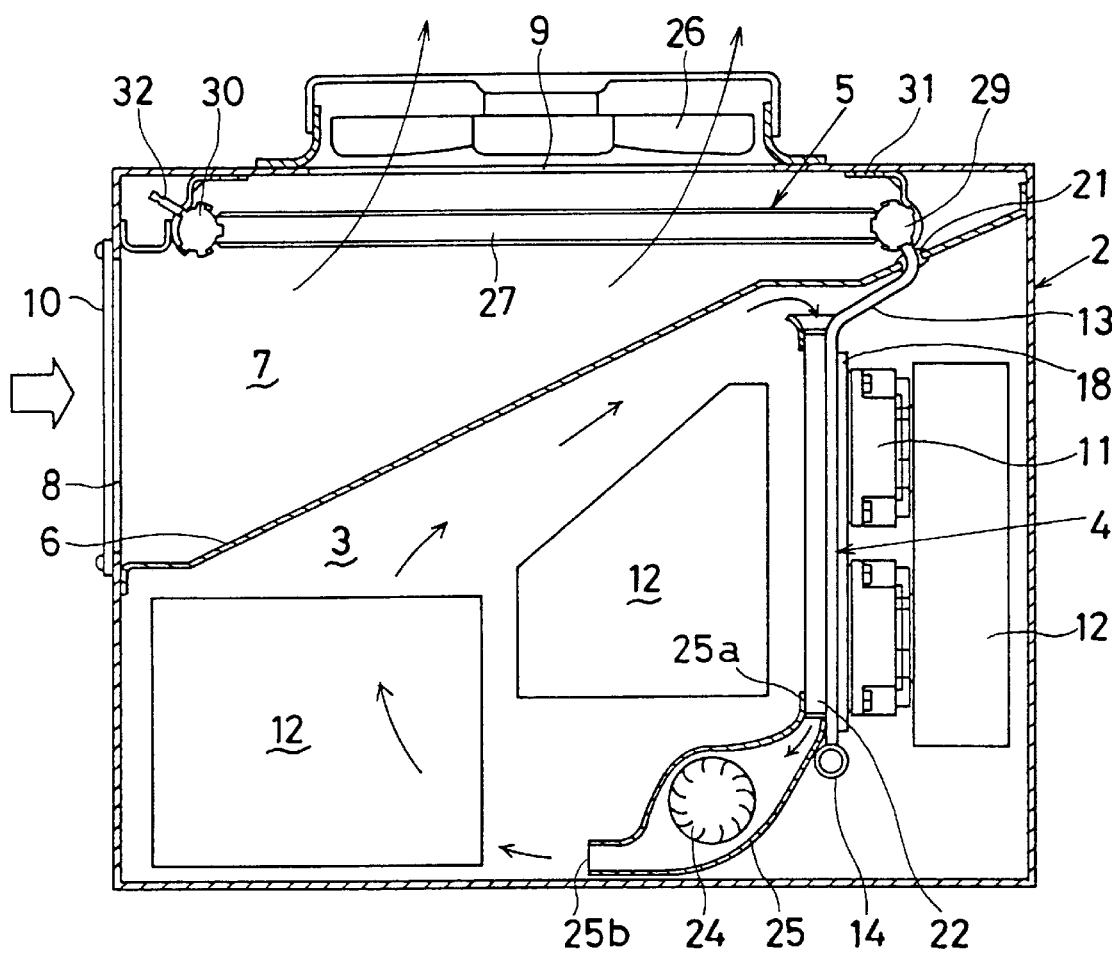
FIG. 1 is a general structural view illustrating a first embodiment where a cooling apparatus using boiling and condensing refrigerant is employed.

FIG. 1 is a general structural view where a cooling apparatus which operates by boiling and condensing refrigerant is used.

Figure 2:
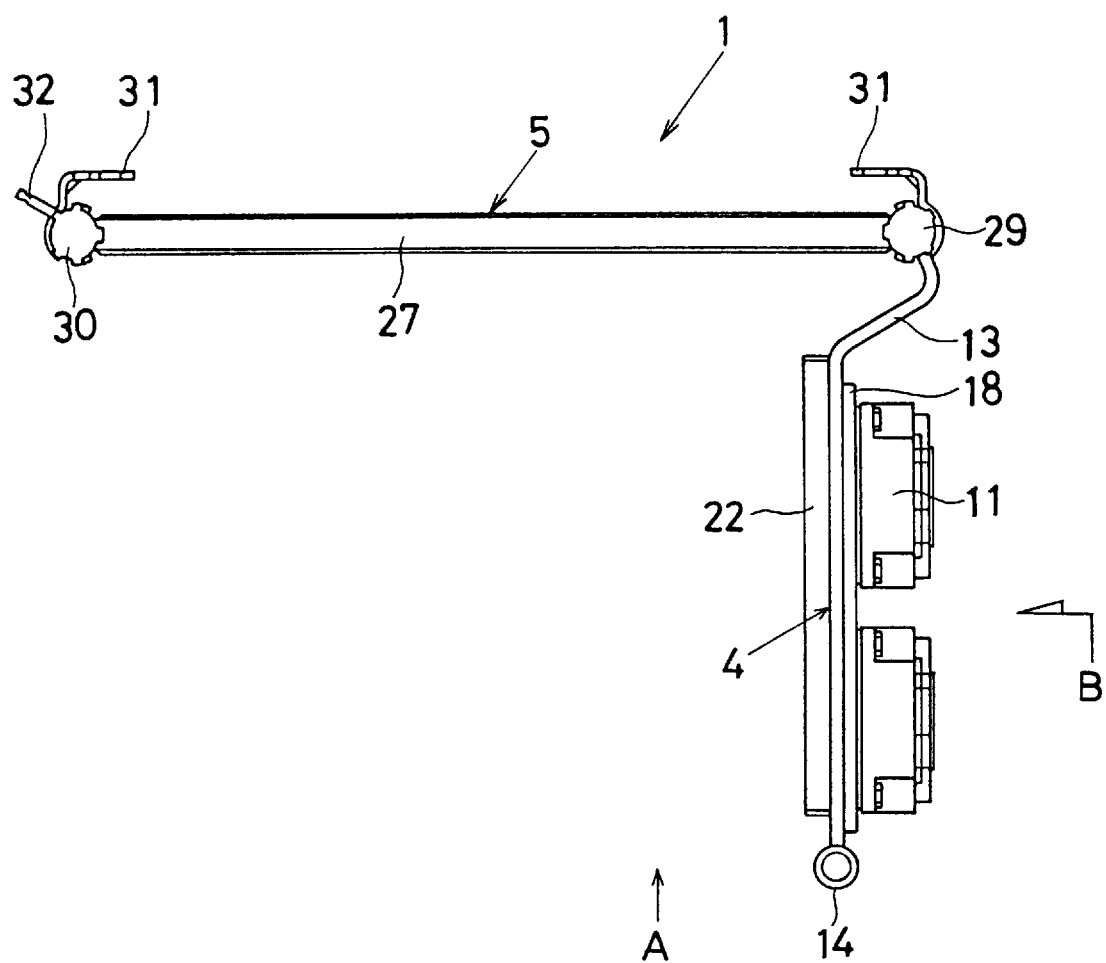
FIG. 2 is a general side view of the cooling apparatus using boiling and condensing refrigerant.

A cooling apparatus 1 using boiling and condensing refrigerant according to this embodiment cools heating elements (which will be described later) installed in a sealed space 3 formed in a casing 2. The cooling apparatus 1 contains a refrigerant tank 4 in which a fluorocarbon type refrigerant is sealed, and a radiator 5 (Refer to FIG. 2).

The interior of the casing 2 is separated by a separator 6 into a sealed space 3 and a non-sealed space 7. An intake port 8 for introducing the air into the non-sealed space 7 and an exhaust port 9 are formed in the walls of the casing 2 by which the non-sealed space 7 is defined. The intake port 8 is provided with an inlet filter 10.

The heating elements includes a first heating element 11 (e.g. Insulated Gate Bipolar Transistor Module) having a high heating density and a second heating element 12 having a low heating density.

Figure 6:
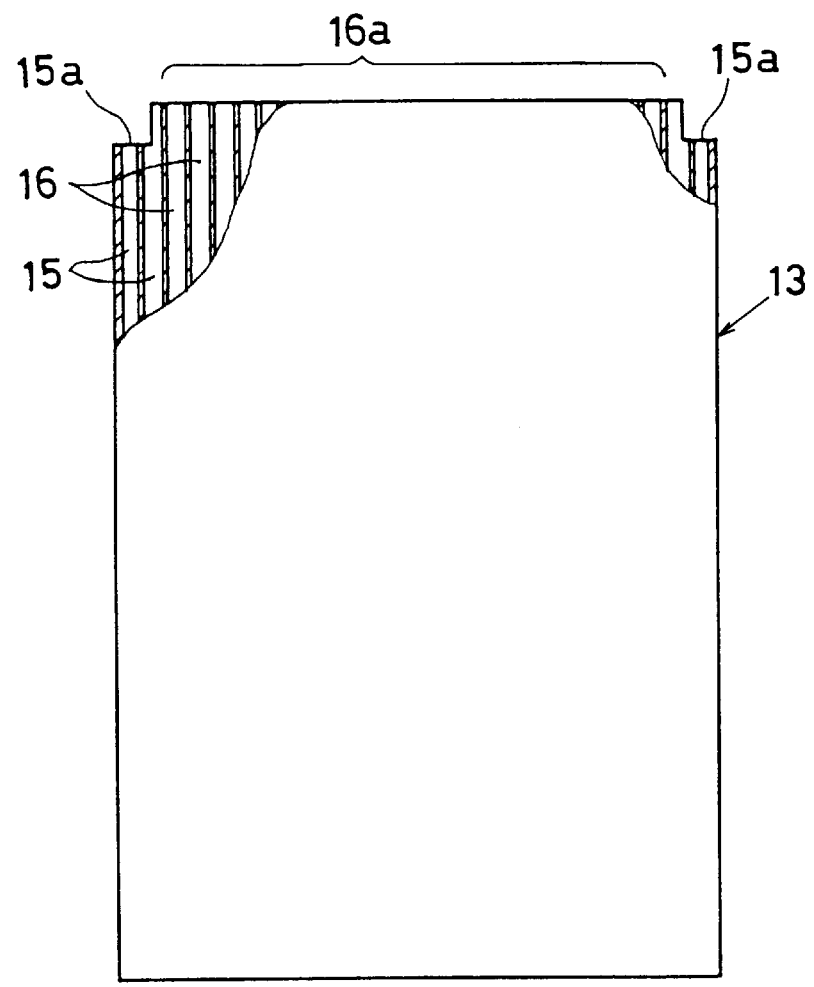
FIG. 6 is a front view including a part of cross section of an extrusion member.
Figure 7:
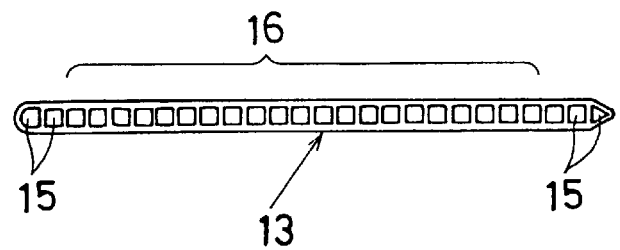
FIG. 7 is a bottom view of the extrusion member.

The refrigerant tank 4 includes an extrusion member 13 made of aluminum and an end cap 14. Two refrigerant tanks 4 are connected in parallel to the radiator 5 (refer to FIG.4). The extrusion member 13, as shown in FIGS. 6 and 7, has a flat and rectangular shape with a thickness smaller than its width. Plural passages extend in the longitudinal direction through the extrusion member 13. In this extrusion member 13, the two lateral ends of the top side, which is adapted to be connected to the radiator 5, are recessed longitudinally (refer to FIG. 6) so that the two recessed passages are respectively used as condensed liquid passages 15, while the rest of the passages are used as vapor passages 16 for passing the vaporized refrigerant.

Figure 4:
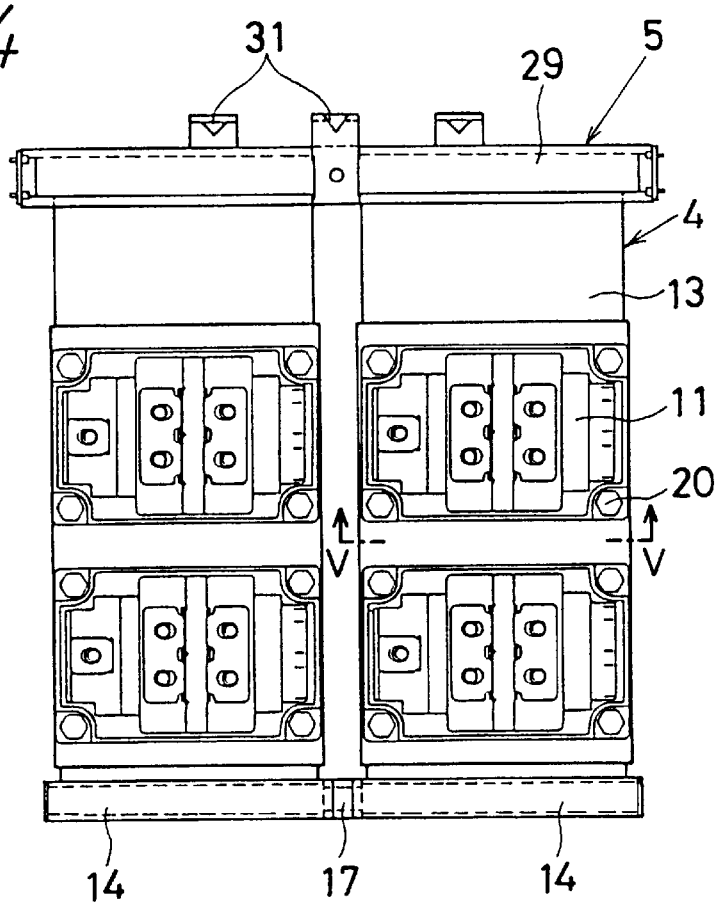
FIG. 4 is a view of the apparatus seen from the direction of an arrow B in FIG. 2.

The end cap 14 is made of aluminum, the same material as that of the extrusion member 13, and has a cylindrical shape. The passages 15 and 16 communicate with each other when the outer circumference of the lower end of the extrusion member 13 is covered with the end cap 14. The end caps 14 of the refrigerant tanks 4, as shown in FIG. 4, are connected with each other through joints 17. Accordingly, the refrigerant tanks 4 (each of passages 15 and 16) communicate with each other, and the refrigerant flows between the end caps 14.

Figure 5:
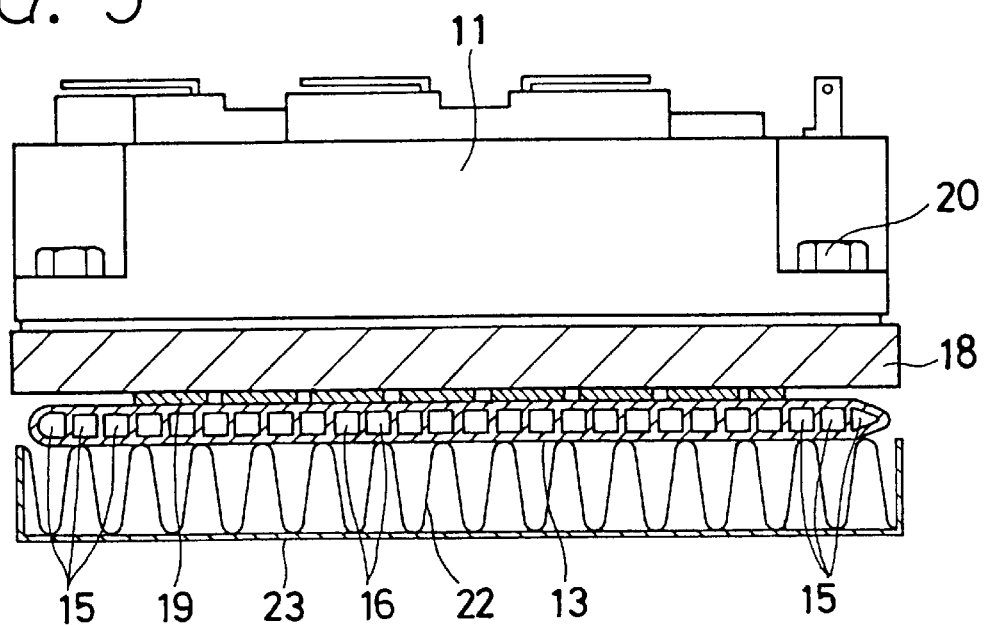
FIG. 5 is a cross-sectional view along line V—V of FIG. 4.

As for the refrigerant tank 4, as shown in FIG. 5, a metal (e.g., aluminum) base plate 18 is joined to one of the walls of the extrusion member 13 through a brazing sheet 19 (a thin sheet whose top and bottom surfaces are cladded with wax), and a first heating element 11 is fastened to the base plate 18 with bolts 20. However, the brazing sheet 19 is disposed to laterally cover only a part of the extrusion member 13 corresponding to steam passages 16, so that the base plate 18 is not in contact directly with the outer wall surface of the condensed liquid passages 15 located on both sides of the extrusion member 13. Thus, the heat of the first heating element 11 is prevented from being transmitted through the base plate 18 directly to the condensate flowing through the condensed liquid passages 15, thereby preventing the condensed liquid in the condensed liquid passages 15 from being boiled and vaporized. Furthermore, a plurality of the second heating elements 12 are disposed within the sealed space 3 without being fixed directly to the refrigerant tank 4 (refer to FIG.1).

The refrigerant tank 4 is, as shown in FIG. 1, disposed in the sealed space 3 within the casing 2. The upper end of the refrigerant tank 4 connected to the radiator 5 is introduced through the insertion hole (not shown) provided in a separator 6 into the non-sealed space 7. However, the upper end portion of the refrigerant tank 4 is first bent towards the heating element 11 in the sealed space 3 and then bent upward to be passed through the insertion hole. This arrangement, compared with the case where the refrigerant tank 4 is installed upright, permits the joint portion with the radiator 5 to be shifted towards the first heating element 11, and the lateral dimension (the left-to-right dimension as shown in FIG. 1) of the casing 2 is thereby reduced by the amount of the shift. Furthermore, a rubber bushing 21 is interposed between the insertion hole in the separator 6 and the refrigerant tank 4 so as to ensure airtightness therebetween.

The other wall surface of the extrusion member 13 (the wall surface opposite to the wall surface to which the first heating element 11 is fixed) is, as shown in FIG. 5, joined to the heat-absorbing fin 22 which absorbs and transmits the heat of the air in the sealed space 3 to the refrigerant in the refrigerant tank 4. The heat-absorbing fin 22, for example, is of a corrugated type formed by bending an aluminum sheet alternately and is covered with a cover 23. The cover 23 is provided not only to protect the heat-absorbing fin 22 but also to maintain a ventilation passage so that the air flow generated by a cross flow fan 24 is effectively introduced into the heat-absorbing fin 22.

In the cross flow fan 24, the intake port 25a of the casing 25 is connected to the bottom of the cover 23, and a blow-off port 25b is open to the sealed space 3. When the cross flow fan 24 is actuated, an air flow is generated in the ventilation passage defined by the cover 23, and the air circulates in the sealed space 3 through the ventilation passage within the cover 23.

Figure 3:
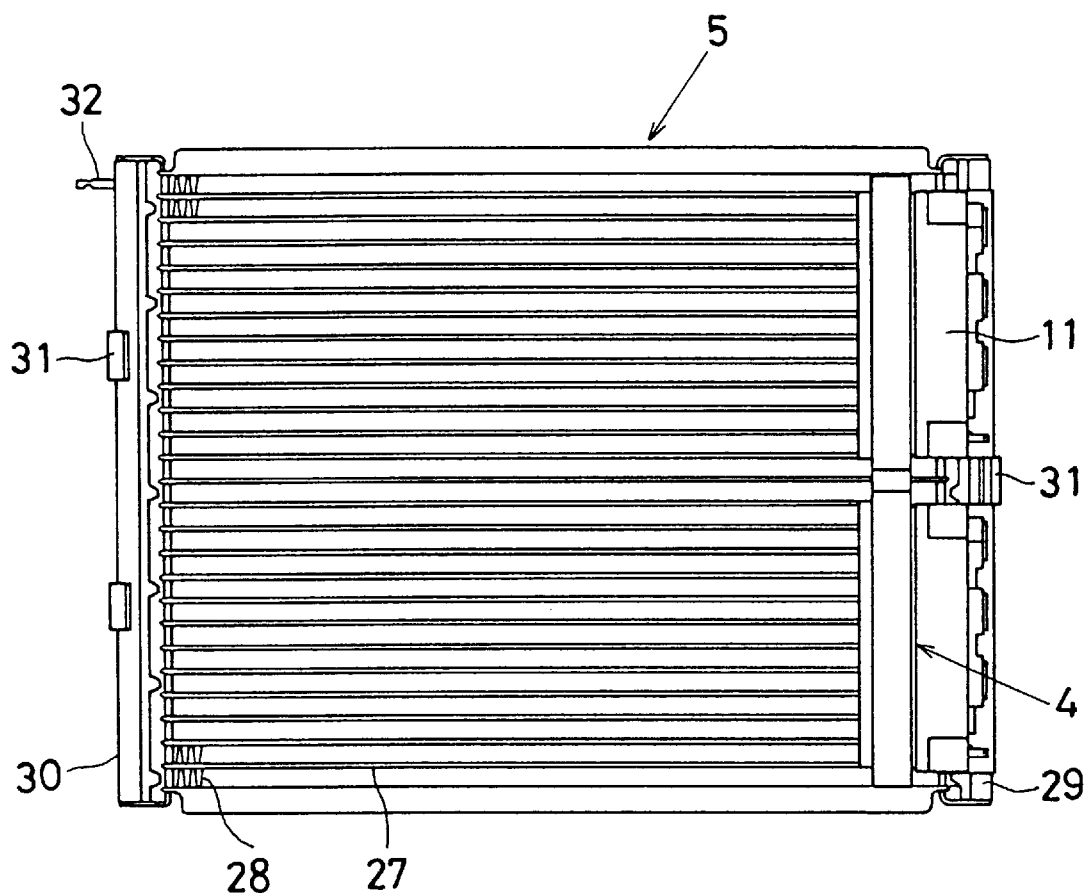
FIG. 3 is a view of the apparatus seen from the direction of an arrow A in FIG. 2.

The radiator 5 condenses and liquefies the refrigerant which has been boiled and vaporized with air flow from axial fan 26 and includes plural radiating tubes 27, radiating fins 28 interposed between the radiating tubes 27 and a tank 29 joined to one end of each of the radiating tubes 27 and a tank 30 joined to the other end of each of radiating tubes 27 (refer to FIG. 3). The radiator 5 is disposed almost horizontally so as to face the exhaust port 9 in the non-sealed space 7 within the casing 2 and fixed to a wall surface of the casing 2 through stays 31 which are respectively fixed to both the tanks 29 and 30. The radiator 5 is slightly inclined as a whole so that the liquefied condensed liquid gathers in the tank 29 (the tank 30 is disposed at a slightly higher level than that of the tank 29).

The axial fan 26 for blowing air to the radiator 5 is fixed to the outside wall of the casing 2 in which the exhaust port is formed, and the axial fan 26, when actuated, generates air flow from the inlet port 8 to the exhaust port 9 in the non-sealed space 7.

Figure 8:
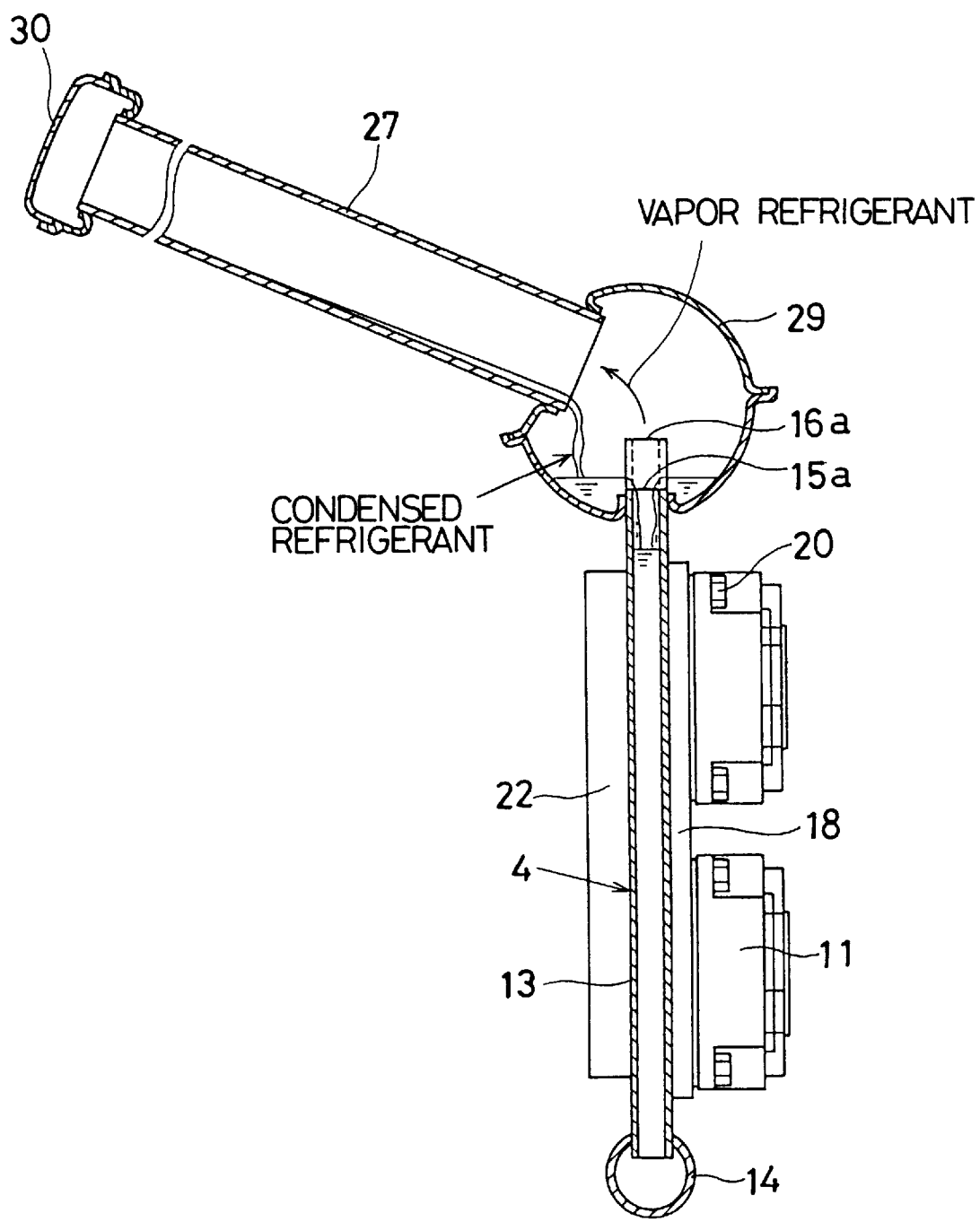
FIG. 8 is a model view illustrating the flow of refrigerant.

The refrigerant tank 4 and the radiator 5 are constituted, as shown in FIG. 8 (a model view obtained by simplifying FIG. 2), such that the upper end of the refrigerant tank 4 (the extrusion member 13) is inserted into the tank 29, (however, the opening (the inlet port 15a) of the upper end of the condensed liquid passage provided on both ends of the extrusion member 13 is inserted until it reaches the inside of the tank 29), and a sealed container is formed by airtightedly joining the joints integrally by brazing. The refrigerant tank 4 and the radiator 5 which constitute the sealed container are filled, after degassing the air from inside respectively, with the refrigerant through the refrigerant sealing port 32 of the tank 30. Then, the end of the refrigerant sealing port 32 is caulked and sealed by welding or the like to seal the refrigerant.

An operation of the cooling apparatus using boiling and condensing refrigerant 1 will be described.

The refrigerant in the vapor passage 16, on which the first heating element 11 is installed, is boiled and vaporized by receiving the heat produced by the first heating element and rises in each of the vapor passages to flow into the tank 29 through the outlet 16a at the upper end of the refrigerant tank 4. Furthermore, the vaporized refrigerant distributed to each of the radiating tubes 27 from the tank 29 is condensed on the inner surfaces of the radiating tubes which have been cooled by the air flow from the axial fan, radiates the latent heat of condensation so as to be liquid drops and returns again into the tank 29. The condensed liquid gathering in the tank 29 flows into the condensed liquid passage 15 through the inlet port 15aat the upper end of the refrigerant tank 4 which is formed at a lower level, flows down in the condensed liquid passage, passes through the end cap 14 and is supplied to each of the vapor passages 16. In this case, the end caps 14 of the refrigerant tanks 4 communicate with each other through the joint 17, so that the condensed liquid is distributed unevenly between the refrigerant tanks, thereby maintaining the amount of refrigerant in the refrigerant tanks at substantially equal levels.

The latent heat of condensation radiated in each radiating tube 27 when the vaporized refrigerant is condensed is transmitted to the radiating fin 28 through the wall of the radiating tube 27, transmitted to the ventilating air passing through the radiating tubes and radiated outside through the exhaust port 9 of the casing 2.

On the other hand, the second heating element 12 disposed in the sealed space 3 is cooled by compulsory cooling with the air sent from the cross flow fan 24 or by natural convection. At this time, the heat of the air in the sealed space 3 is transmitted to the refrigerant in the refrigerant tank through the heat-absorbing fin 22 fixed to the refrigerant tank 4, to prevent a rise in temperature within the sealed space 3 due to the heat generated by the second heating element. Thus, the second heating element 12 can be cooled appropriately by compulsory convection of air from the cross flow fan 24 or by natural convection. Accordingly, such cooling may not necessarily be performed directly by the cooling apparatus using boiling and condensing refrigerant 1.

According to this embodiment, the first heating element 11 having a high heating density is directly fixed to the refrigerant tank 4 for cooling by boiling/condensation heat transmission, while the second heating element 12 having a low heating density can be cooled by lowering the temperature of the sealed space 3 through the heat-absorbing fin 22 fixed to the refrigerant tank 4. In this way, as different from the conventional type, plural elements having different heating densities from each other can be cooled without using an air conditioner, thereby making it possible to reduce the dimension of the entire cooling device including the casing as well as the manufacturing cost thereof.

A second embodiment of the present invention will be described.

Figure 9:
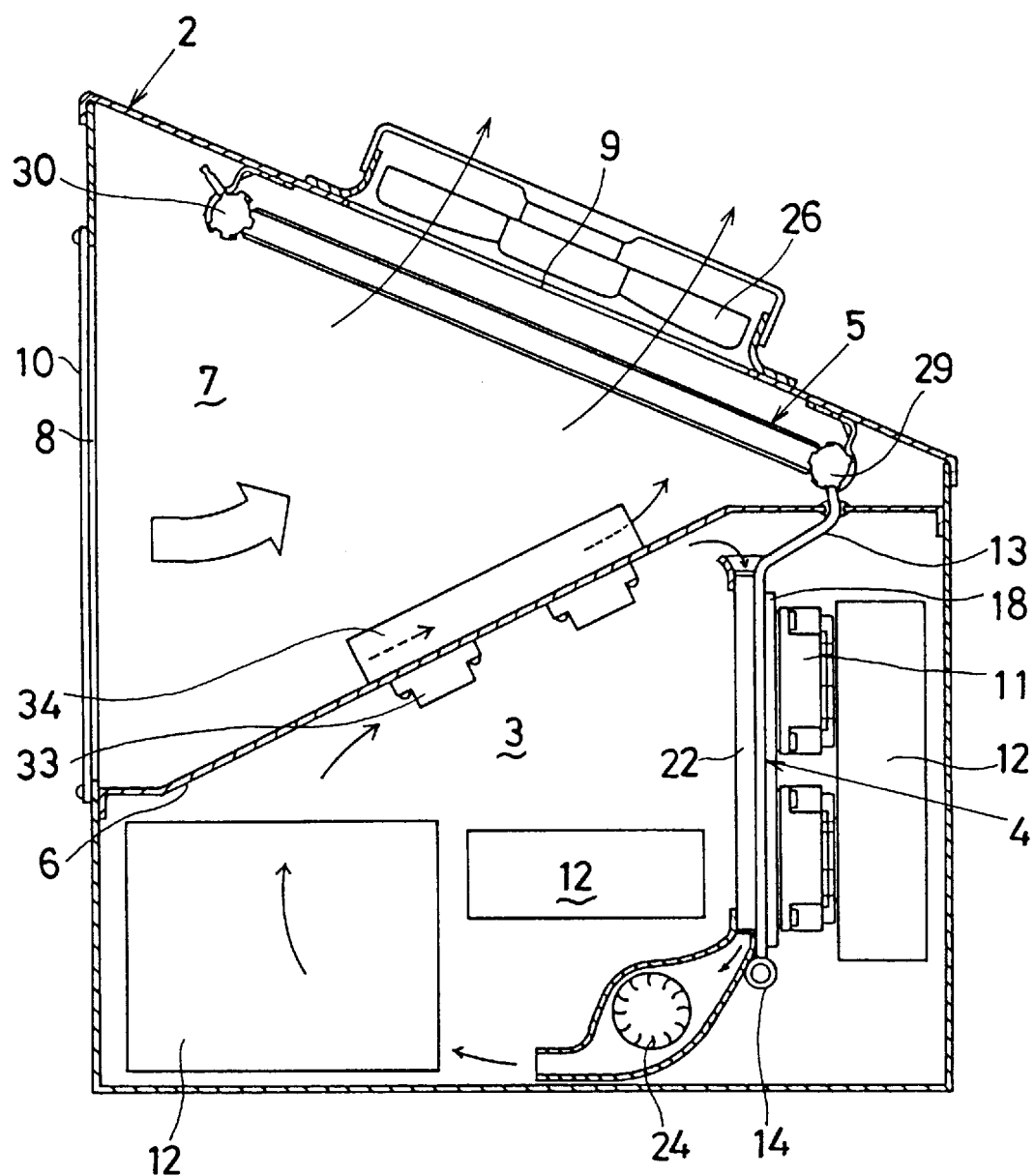
FIG. 9 is a general structural view illustrating a second embodiment where the cooling apparatus using boiling and condensing refrigerant is employed.

FIG. 9 is a general structural view illustrating the second embodiment where the cooling apparatus 1 using boiling and condensing refrigerant is employed.

In this embodiment, a third heating element 33 having a intermediate heating density is further cooled, which cannot be sufficiently cooled by the natural or forced convection as described in the first embodiment.

The third heating element 33 is fixed to the separator 6 in the sealed space 3. The separator 6, to which the third heating element 33 is fixed, has an air cooling fin 34 fixed on its side facing the non-sealed space 7. In this way, the heat generated by the third heating element 33 is transmitted to the air cooling fin 34 through the separator 6 and emitted from the air cooling fin 34 into the air within the non-sealed space 7 to cool the third heating element 33. In this case, the angle of inclination of the radiator 5 to the refrigerant tank 4 can be varied properly and the air flow generated by the axial fan 26 is introduced through the air cooling fin 34 so as to maximize radiation efficiency.

Furthermore, the angle of inclination of the radiator 5 to the refrigerant tank 4 can be selected freely by properly varying the bending angle of the extrusion member 13.

A third embodiment of the present invention will be described.

Figure 10:
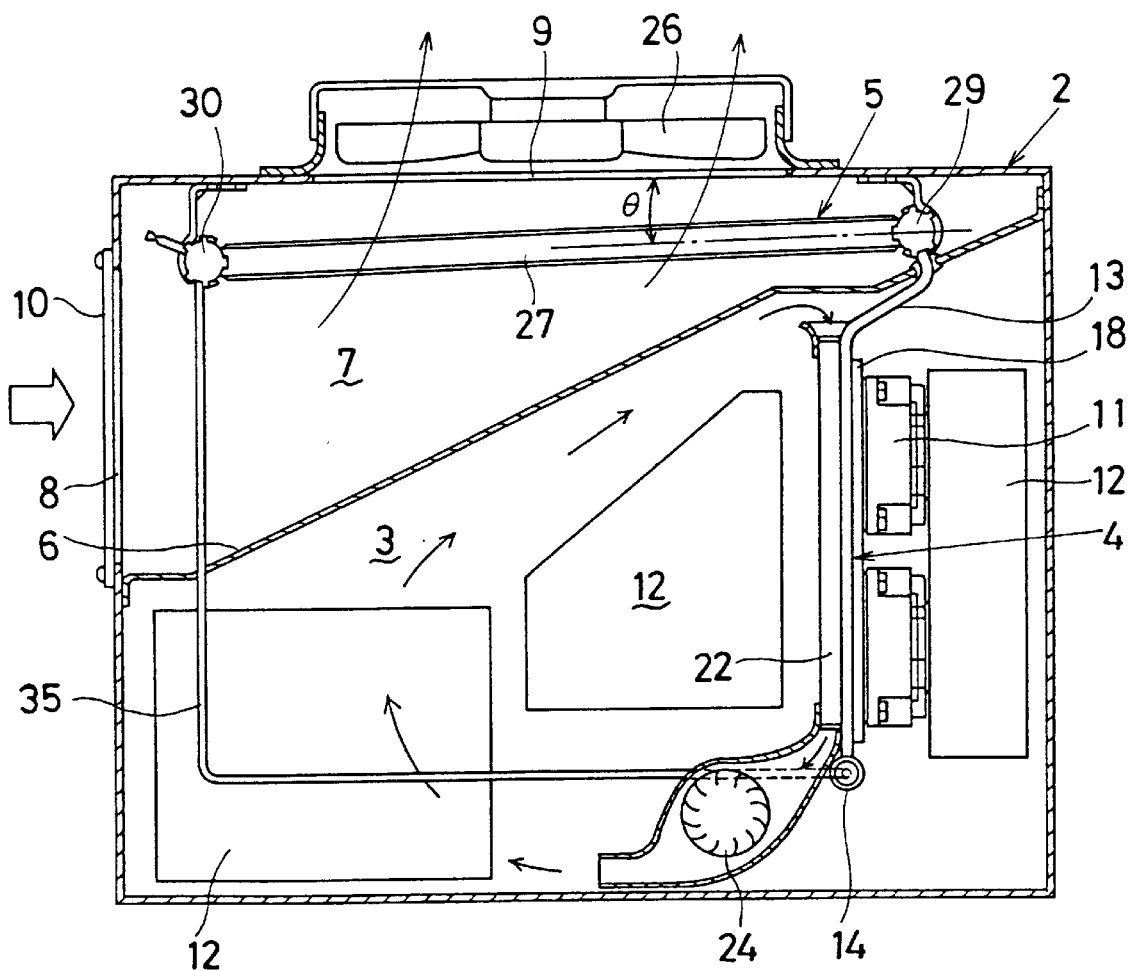
FIG. 10 is a general structural view illustrating a third embodiment where the cooling apparatus using boiling and condensing refrigerant is employed.

FIG. 10 is a general structural view illustrating the third embodiment where the cooling apparatus 1 using boiling and condensing refrigerant is employed.

In this embodiment, the tank 30 of the radiator 5 and the end cap 14 of the refrigerant are connected with the tubes 35 for the condensed liquid (the liquid return passage of the present invention).

The radiator 5 is inclined (by θ) in the direction opposite to the direction according to the first embodiment (i.e., the tank 30 is disposed at a slightly lower level than that of the tank 29) so that the condensed liquid liquefied by condensation in the radiating tubes 27 flows into the tank 30.

The tube 35 introduces the condensed liquid gathering in the tank 30 directly into the end cap 14 of the refrigerant tank 4 and connects the tank 30 and the end cap 14 with each other as shown in FIG. 10.

In this embodiment, the condensed liquid formed by condensation in the radiator 5 is always supplied directly into the end cap 14 of the refrigerant tank 4 by way of the tube 35, so that all of the passages in the refrigerant tank 4 are used as vapor passages 16.

A fourth embodiment of the present invention will be described.

Figure 11:
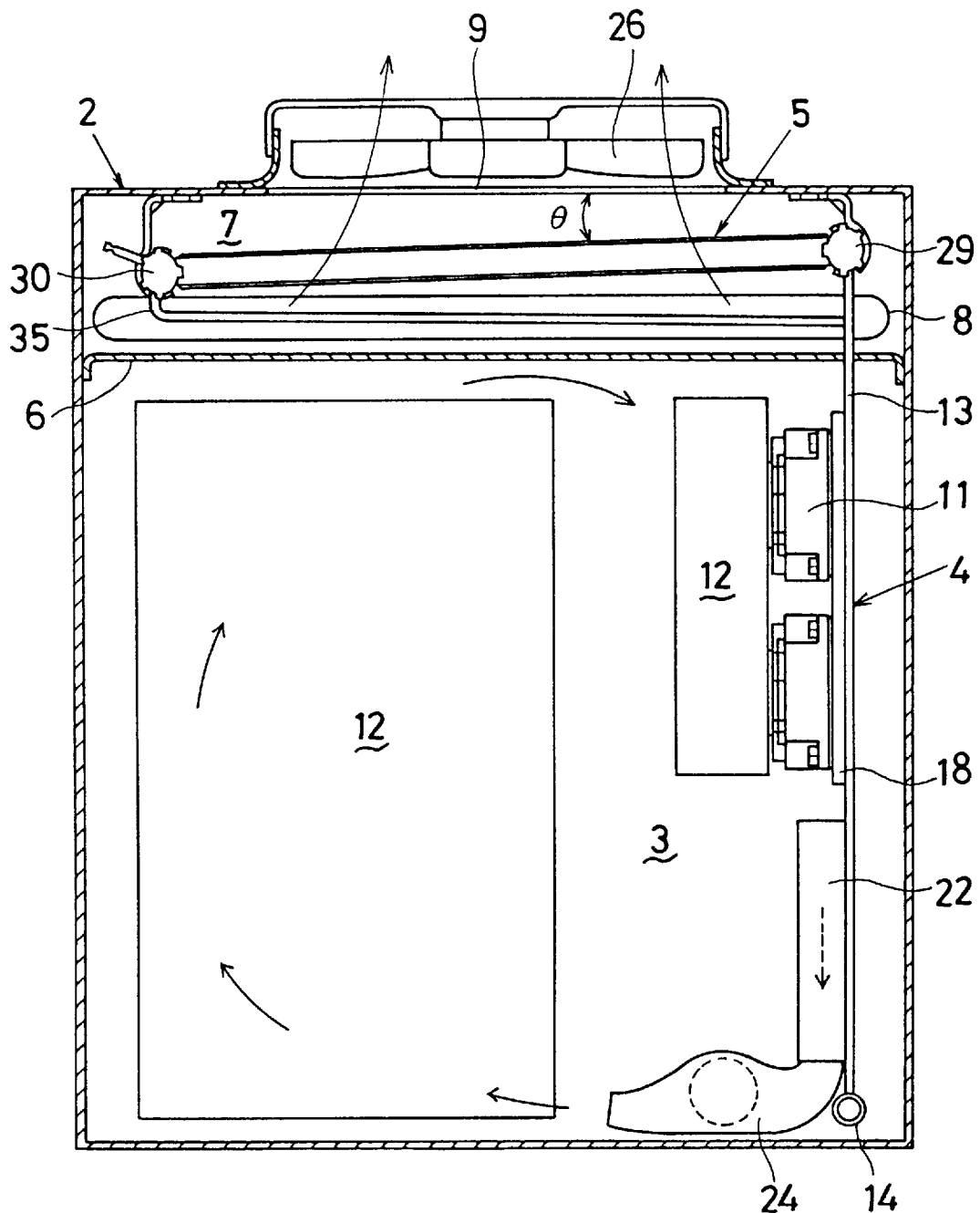
FIG. 11 is a general structural view illustrating a fourth embodiment where the cooling apparatus using boiling and condensing refrigerant is employed.

FIG. 11 is a general structural view showing the fourth embodiment where the cooling apparatus 1 using boiling and condensing refrigerant is employed.

In this embodiment, the end on the side of the refrigerant tank 4, of the tube 35 as described in the third embodiment is connected to the upper end of the refrigerant tank 4.

Figure 12:
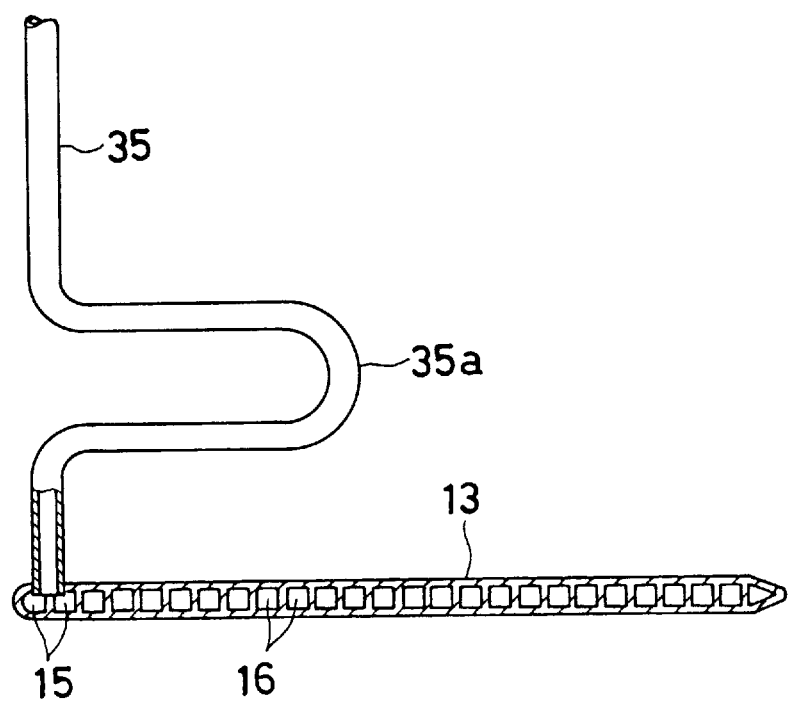
FIG. 12 is a plan view showing a shape of a stress reliever installed on a tube for a condensed liquid according to a fourth embodiment.

In returning the condensate gathered in the tank 30 directly to the refrigerant tank 4 though the condensate tube 35, one end of which is connected to the tank 30, the other end of the condensate tube 35 may be connected to the condensed liquid passage 15 of the extrusion member 13 as described in the first embodiment. In this case, however, as shown in FIG. 12, the tube 35 is provided with a stress reliever 35a in order to reduce the effect of the thermal stress caused by the difference in temperature of the condensate tube 35 between the side of the radiator 5 and the side of the refrigerant tank 4.

A fifth embodiment of the present invention will be described.

Figure 13:
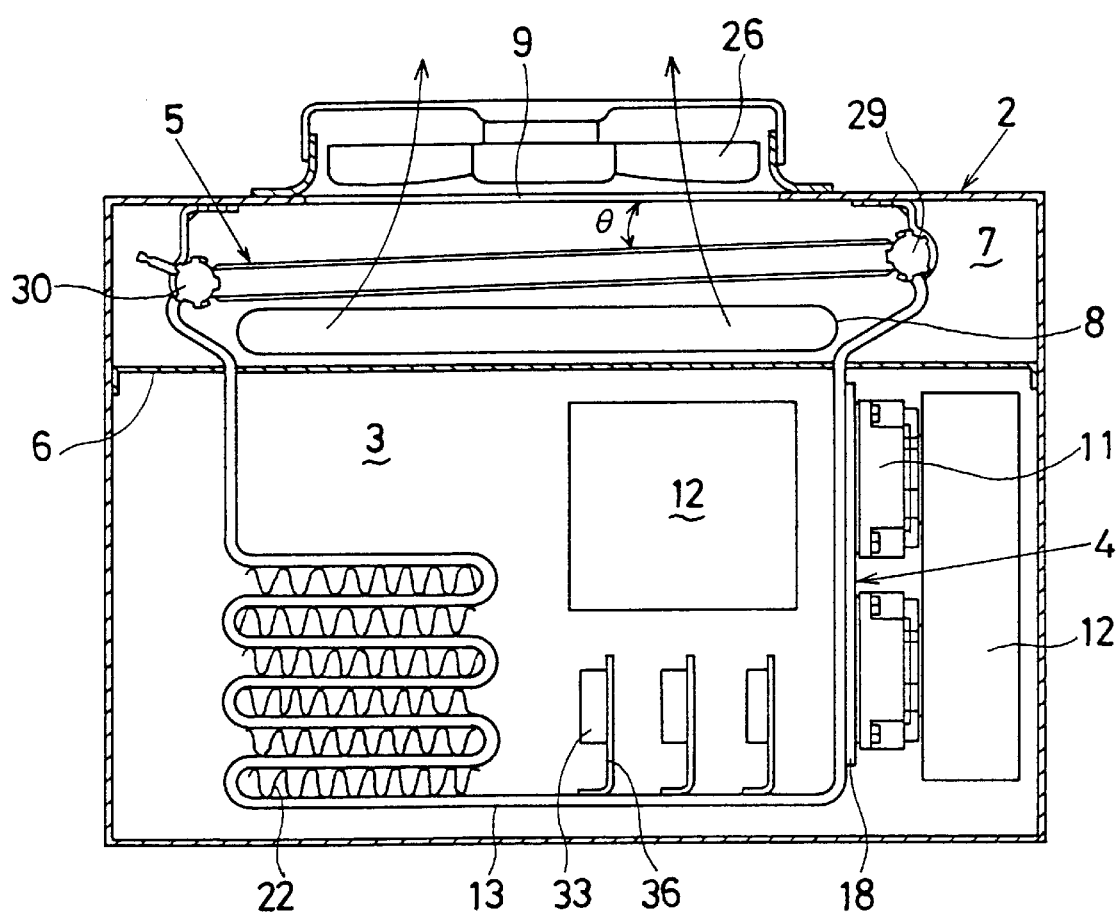
FIG. 13 is a general structural view illustrating a fifth embodiment where the cooling apparatus using boiling and condensing refrigerant is employed.

FIG. 13 is a general structural view where the cooling apparatus 1 using boiling and condensing refrigerant is employed.

In this embodiment, the tube 35 as described in the third embodiment is integrally formed with the extrusion member 13 as a part of the refrigerant tank 4. Thus, according to this embodiment, in the same manner as in the third embodiment, all of the passages in the refrigerant tank 4 can be used as vapor passages 16.

Furthermore, according to this embodiment, a heat absorber having an aspect ratio close to 1 can easily be constituted by bending a part zigzag part (the portion corresponding to the tube 35) of the refrigerant tank 4 into a zigzag shape and interposing the heat-absorbing fins 22 between the wall surfaces facing each other. As a result, even a low-cost axial fan (not shown) can be used instead of the cross flow fan 24 as described in the first embodiment to supply the air into the heat-absorbing fin 22.

Furthermore, when the third heating element 33, which has an intermediate heating density and cannot be installed directly on the refrigerant tank 4 as different from the first heating element 11 due to the insufficient cooling capacity by natural or forced convection and the limitation in view of the layout, has to be cooled, the third heating element may be installed on a heat sink 36 attached to the refrigerant tank 4. Further, the heat sink 36 is preferably made of a metal material having a high thermal conductivity and a high deformability (e.g., aluminum).

Although the present invention has been fully described in connection with the preferred embodiments thereof with reference to the accompanying drawings, it is to be noted that various changes and modifications will become more apparent to those skilled in the art. Such changes and modifications are to be understood as being included within the scope of the present invention as defined in the appended claims.

What is claimed is:

1. A cooling apparatus for cooling heating elements using boiling and condensing refrigerant, said cooling apparatus comprising:

a casing for forming a substantially sealed space and accommodating therein heating elements including a first heating element and a second heating element;

a refrigerant tank disposed in said sealed space and filled with refrigerant said refrigerant tank being provided with said first heating element so that the refrigerant sealed in said refrigerant tank is boiled and vaporized by heat generated by said first heating element;

a radiator connected to said refrigerant tank and disposed outside said sealed space for liquefying the refrigerant in gaseous phase in said refrigerant tank, a heat-receiving fin installed in said refrigerant tank for absorbing heat from air in said sealed space wherein said refrigerant tank includes an extrusion member formed by extruding so as to have a vapor flow passage through which refrigerant vaporized by heat of said heating elements flows out and a condensed liquid passage into which condensed liquid liquefied by said radiator flows integrally, and wherein a part of said extrusion member is bent in a zigzag shape so as to have wall surfaces into which said heat-absorbing fin is interposed.

2. A cooling apparatus. for cooling heating elements using boiling and condensing refrigerant said cooling apparatus comprising:

a casing for forming a substantially sealed space and accommodating therein heating elements including a first heating element and a second heating element:

a refrigerant tank disposed in said sealed space and filled with refrigerant, said refrigerant tank being provided with said first heating element so that the refrigerant sealed in said refrigerant tank is boiled and vaporized by heat generated by said first heating element;

a radiator connected to said refrigerant tank and disposed outside said sealed space for liquefying the refrigerant in gaseous phase in said refrigerant tank, a heat-receiving fin installed in said refrigerant tank, for absorbing heat from air in said sealed space wherein said second heating element is disposed independently from said refrigerant tank so as to be cooled by convection in said sealed space;

a third heating element attached to said casing in said sealed space, said third heating element having an intermediate heating density between said first heating element and said second heating element; and an air cooling fin attached to said casing and disposed outside said sealed space at a position on an opposite surface from where said third heating element is attached.

3. A cooling apparatus using boiling and condensing refrigerant, for cooling heating elements, said cooling apparatus comprising:

a casing for forming a substantially sealed space and accommodating therein heating elements including a first heating element and a second heating element;

a refrigerant tank disposed in said sealed space and filled with refrigerant, said refrigerant tank being provided with said first heating element so that the refrigerant sealed in said refrigerant tank is boiled and vaporized by heat generated by said first heating element;

a radiator including a radiating tube disposed outside said sealed space and forming a refrigerant passage so that the refrigerant in a gaseous phase, which has been vaporized in said refrigerant tank, is liquefied and condensed, a first tank disposed at one end of said radiating tube and connected to said refrigerant tank to introduce the refrigerant in a gaseous phase vaporized in said refrigerant tank thereinto and a second tank disposed at the other end of said radiating tube and at a position lower than that of said first tank so that condensed liquid liquefied in said radiating tube is introduced into said second tank; and means for forming a liquid return passage for communicating said second tank with a bottom of said refrigerant tank to introduce condensed liquid into said refrigerant tank from said second tank, a part of said liquid return passage being bent into a zigzag shape so as to have a space between adjacent bent portions;

a heat-absorbing fin disposed in said space, for adsorbing heat of air in said sealed space.

4. A cooling apparatus according to claim 3, wherein, said second heating element is disposed independently from said refrigerant tank so as to be cooled by convection in said sealed space.

5. A cooling apparatus according to claim 4, wherein said liquid return passage is provided with a third heating element by a member having a high thermal conductivity.

6. A cooling apparatus according to claim 5, wherein said liquid return passage is integrally formed with said refrigerant tank by an extrusion member formed by extruding.

7. A cooling apparatus for cooling a heating element using boiling and condensing refrigerant, said cooling apparatus comprising:

a casing having an interior space;

a separator disposed in said casing for separating said interior space into a high temperature region where high temperature fluid is accommodated and a low temperature region where low temperature fluid is accommodated;

a first heating element disposed in said high temperature region:

a refrigerant tank into which refrigerant is sealed and having a side surface to which said first heating element is attached, said refrigerant being boiled and vaporized by heat generated by said first heating element;

a second heating element disposed in said high temperature fluid, a generating heat of said second heating element being smaller than that of said first heating element;

a heat-receiving fin connected to said refrigerant tank by being melted thereto, for receiving heat generated by said second heating element through said high temperature fluid and transferring the heat to said refrigerant tank:

a communication pipe, one end of which is airtightly connected to said refrigerant tank and the other end of which is extended to said low temperature fluid while passing through said separator;

a condensing portion airtightly connected to the other end of said communication pipe and being disposed in said low temperature region, for condensing said refrigerant by radiating heat of refrigerant boiled and vaporized in said refrigerant tank to said low temperature fluid;

a third heating element attached to said separator in high temperature region, said third heating element having an intermediate generating heat between said first heating element and said second heating element; and an air cooling fin attached to said separator in said low temperature region at a position corresponding to said third heating element.

8. A cooling apparatus using boiling and condensing refrigerant, for cooling a heating element, said cooling apparatus comprising:

a casing having an interior space;

a separator disposed in said casing, for separating said interior space into a high temperature region where high temperature fluid is accommodated and a low temperature region where low temperature fluid is accommodated;

a first heating element and a second heating element disposed in said high temperature region;

a refrigerant tank into which refrigerant is sealed, said refrigerant tank having a heat-receiving fin connected thereto for receiving heat generated by said second heating element through said high temperature fluid, said refrigerant being boiled and vaporized by heat generated by said first heating element;

a communication pipe, one end of which is airtightly connected to said refrigerant tank and the other end of which is extended to said low temperature fluid while passing through said separator;

a condensing portion airtightly connected to the other end of said communication pipe and being disposed in said low temperature region, for condensing said refrigerant by radiating heat refrigerant boiled and vaporized in said refrigerant tank to said low temperature fluid;

a first heating element having a greater generating heat than said second heating element, said first heating element being attached to said refrigerant tank;

a fan disposed in said sealed space, for generating an air flow in said sealed space;

a cover for covering the heat-receiving fin to form, with the refrigerant tank, an air path having an inlet and an outlet wherein the air flow generated by the fan in the sealed space flows from the inlet to the outlet;

a third heating element attached to said separator in said high temperature region, said third heating element having an intermediate generating heat between said first heating element and said second heating element; and an air cooling fin attached to said separator in said low temperature region at a position corresponding to said third heating element.

* * * * *